United States Patent
Nakata

(10) Patent No.: US 6,198,037 B1
(45) Date of Patent: Mar. 6, 2001

(54) SOLAR BATTERY MODULE FOR OPTICAL ELECTROLYSIS DEVICE AND OPTICAL ELECTROLYSIS DEVICE

(76) Inventor: Josuke Nakata, 112-17, Kamiootani, Kuse, Jyoyo-shi, Kyoto 610-01 (JP)

( * ) Notice: Subject to any disclaimer, the term of this patent is extended or adjusted under 35 U.S.C. 154(b) by 0 days.

(21) Appl. No.: 09/381,350

(22) PCT Filed: Jan. 23, 1998

(86) PCT No.: PCT/JP98/00290

§ 371 Date: Sep. 17, 1999

§ 102(e) Date: Sep. 17, 1999

(87) PCT Pub. No.: WO99/38215

PCT Pub. Date: Jul. 29, 1999

(51) Int. Cl.⁷ .................................................. H01L 25/00
(52) U.S. Cl. ........................ 136/246; 136/248; 136/250; 205/923
(58) Field of Search .................................. 136/246, 248, 136/250; 205/923

(56) References Cited

FOREIGN PATENT DOCUMENTS

| | | |
|---|---|---|
| 54-004280 | 1/1979 | (JP) . |
| 56-163285 | 12/1981 | (JP) . |
| 59-177385 | 10/1984 | (JP) . |
| 61-096094 | 5/1986 | (JP) . |
| 61-220482 | 9/1986 | (JP) . |
| 03008455 | 1/1991 | (JP) . |
| 4013880 | 1/1992 | (JP) . |
| 08125210 | 5/1996 | (JP) . |

*Primary Examiner*—Mark Chapman
(74) *Attorney, Agent, or Firm*—Morrison Law Firm

(57) ABSTRACT

Partition member 34 is provided, which partitions the interior of glass container 31 into reduction reaction chamber 32 and oxidation reaction chamber 33 and which is made of a polymer electrolyte that conducts hydrogen ions; solar battery modules 35 are mounted on this partition member 34, for example in a matrix arrangement of five rows and three columns; a solar battery module 35 has a photocell array (photoelectromotive force: 2.0–2.4 V) consisting of four spherical solar battery elements (photoelectromotive force: 0.5–0.6 V) connected in series, anode 46, and cathode 48; solar battery modules 35 are mounted on partition member 34 so that anode 46 is in contact with the electrolyte of oxidation reaction chamber 33 and cathode 48 is in contact with the electrolyte of reduction reaction chamber 32; sunlight is shined on solar battery modules 35, and the photoelectromotive force electrolyzes the water and produces hydrogen gas from cathode 48 and oxygen gas from anode 46.

30 Claims, 7 Drawing Sheets

SOLAR BATTERY MODULE FOR OPTICAL ELECTROLYSIS DEVICE AND OPTICAL ELECTROLYSIS DEVICE

TECHNICAL FIELD

This invention concerns a solar battery module for a photoelectrolytic device and a photoelectrolytic device that employs the solar battery module; in particular, it concerns technology in which the electrolysis of an electrolyte is carried out by solar energy using a solar battery module in which multiple spherical solar battery elements are connected in series and that generates the required electrolysis voltage.

BACKGROUND TECHNOLOGY

Heretofore there have been attempts in which water is electrolyzed by the photoelectromotive force produced by titanium oxide ($TiO_2$), but because the wavelength of the light that allows energy conversion with titanium oxide is about 420 nm or less, the energy conversion efficiency with respect to sunlight is very low, and this technology has not been put to practical use. Heretofore, technology to electrolyze an electrolyte with the photoelectromotive force of sunlight by means of a solar battery immersed in the electrolyte has appeared in U.S. Pat. No. 4,021,323 and in unexamined patent application publication H6-125210 [1994] relating to the present applicant.

The U.S. patent discloses a solar battery array in which a pn junction is formed on spherical crystals of silicon and a common metal electrode film is formed on these multiple spherical crystals (a micro photoelectric cell), and a photochemical energy conversion device is described in which such an array of solar batteries is immersed in an electrolyte, and a solution of hydriodic acid or hydrobromic acid electrolyzed by the photoelectromotive force of sunlight.

Unexamined patent application publication H6-125210 [1994] discloses an array of light receiving elements in which multiple spherical crystals are formed near the surface of a semiconductor crystal substrate in matrix form and integral with the semiconductor crystal substrate, a photoelectromotive force generation part including pn junctions is formed on the surface part of the spherical crystals, and individual front-surface electrodes and a common back-surface electrode are formed on these multiple spherical crystals; it also discloses a photoelectrolytic device that includes the array of light receiving elements.

But with the technology described in these two documents, the direction in which sunlight can be received is limited to one surface, making it difficult to increase the light utilization rate in making use of the light in a light space.

In forming a solar battery array and individually forming the electrode films on the array of light receiving elements, the size of the photoelectromotive force is determined by the number of serial junctions of spherical crystals on which a pn junction is formed, so the solar battery array and array of light receiving elements must be designed and fabricated for each photoelectrolytic device. This makes it difficult to reduce the cost of fabricating solar battery arrays and arrays of light receiving elements suitable for photoelectrolytic devices, and makes it difficult to fabricate solar battery arrays and arrays of light receiving elements of wide application suitable for photoelectrolytic devices of various types and sizes.

The inventor of this invention has done research on photoelectrolytic devices that employ spherical semiconductor devices (of diameter about 0.5–2.0 mm) that function as micro photoelectric cells (or micro photocatalysts). In a photoelectrolytic device of this kind, it is necessary to support many small-particle spherical semiconductor devices in an electrolyte arranged so they can receive light, and to surely separate the reaction products, but as yet no structure has been proposed for thus arranging and supporting a large number of spherical semiconductor devices.

The purpose of this invention is to provide a solar battery module for a photoelectrolytic device that makes use of multiple independent grain-shaped spherical solar battery elements. A further purpose of this invention is to provide a solar battery module for a photoelectrolytic device in which one can appropriately set the size of the photoelectromotive force. Another purpose of this invention is to provide a solar battery module for a photoelectrolytic device of superior generality that can be applied to various photoelectrolytic devices. Another purpose of this invention is to provide a solar battery module for a photoelectrolytic device that can receive sunlight from various directions.

Another purpose of this invention is to provide a solar battery module for a photoelectrolytic device that can prevent overvoltage at the electrolysis electrodes and can promote the separation of reaction products from the electrodes. Another purpose of this invention is to provide a solar battery module for a photoelectrolytic device that has electrolysis electrodes having a catalytic function. Another purpose of this invention is to provide a photoelectrolytic device in which the solar battery module for a photoelectrolytic device is applied.

DISCLOSURE OF THE INVENTION

The solar battery module for a photoelectrolytic device of this invention is characterized in that it has multiple spherical solar battery elements, a transparent cylindrical holding member that accommodates and holds these spherical solar battery elements in a condition where they are electrically connected in series, and a pair of electrolysis electrodes that are mounted liquid-tightly on both ends of this holding member and are exposed to the outside of the holding member; each of the spherical solar battery elements has a p-type or n-type spherical semiconductor crystal, a photoelectromotive force generation part that includes a pn junction formed on the surface part of this spherical semiconductor crystal, and a pair of electrodes formed on both ends that is symmetrical about the center of the spherical semiconductor crystal in order to tap the photoelectromotive force that is generated by this photoelectromotive force generation part, and in a state in which it is immersed in an electrolyte, it is suitable for electrolysis of the electrolyte by the photoelectromotive force caused by sunlight.

Here, it is desirable to set the number of the multiple spherical solar battery elements in accordance with the voltage of the photoelectromotive force to be generated by the photoelectromotive force generation part and the electrolysis voltage needed for the electrolyte. On each surface of the pair of electrolysis electrodes it is desirable to form a metal form that has a catalytic function that promotes electrolytic reactions. And it is desirable to form on the part of the electrolysis electrodes that comes into contact with the electrolyte a pointy tip in order to reduce the overvoltage and promote the separation of reaction products.

In the solar battery module for a photoelectrolytic device, multiple spherical solar battery elements are accommodated in a transparent holding member in a state in which they are connected electrically in series, so a photoelectromotive force is generated by light that is incident from various directions. The size of the photoelectromotive force can be set freely by varying the number of series-connected spherical solar battery elements, which provides superior generality that can be applied to various photoelectrolytic devices. By forming a metal film that has a catalytic function on the surface of the electrolysis electrodes, the electrolysis can be speeded up by the catalytic effect. And by forming a pointy tip on the electrolysis electrodes, overvoltage can be reduced and the separation of reaction products can be promoted.

The photoelectrolytic device of this invention is characterized in that it has a container that accommodates an electrolyte inside it and into which sunlight can be introduced; multiple solar battery modules that are arranged in a state in which they are immersed in an electrolyte inside this container, receive sunlight, and generate photoelectromotive force; and a partition member that partitions the space between the electrolysis anode and the electrolysis cathode of these solar battery modules to make it possible to separate the reaction products produced at both electrodes, and on which multiple solar battery modules are piercingly mounted.

Here, it is desirable that each solar battery module have multiple spherical solar battery elements that each have a p-type or n-type spherical semiconductor crystal, a photoelectromotive force generation part that includes a pn junction formed on the surface part of this spherical semiconductor crystal, and a pair of electrodes formed on both ends that is symmetrical about the center of the spherical semiconductor crystal in order to tap the photoelectromotive force that is generated by this photoelectromotive force generation part; a transparent cylindrical holding member that accommodates and holds these spherical solar battery elements in a condition where they are electrically connected in series; and an electrolysis anode and electrolysis cathode that are mounted liquid-tightly on both ends of this holding member and are exposed in the electrolyte. It is also desirable that the composition be such that sunlight can shine into the container at least from above. Also, the partition member may consist of a solid polymer electrolyte, and if so, the polymer electrolyte may be a hydrogen ion conductor.

When sunlight shines onto this photoelectrolytic device, a photoelectromotive force is generated in the multiple solar battery modules, oxidation reactions occur at the electrolysis anode of each solar battery module, and reduction reactions occur at the electrolysis cathode. Because a partition member is provided that forms a partition between the anode and cathode to make it possible to separate the reaction products that are produced at both electrodes, the oxidation reaction products and the reduction reaction products can be removed to the outside while remaining separated by the partition member. Moreover, multiple solar battery modules are mounted piercingly on this partition member, simplifying the composition for mounting and supporting multiple solar battery modules.

Each solar battery module of this photoelectrolytic device performs itself the same effects as the aforesaid solar battery module for a photoelectrolytic device. If the partition member consists of a polymer electrolyte, ions will permeate through the partition member, so ions can be allowed to migrate while maintaining the function of keeping the reaction products isolated from each other. For example, if it is necessary to allow the hydrogen ions produced by electrolysis to permeate through, the partition member may be made of a hydrogen ion-conducting polymer electrolyte.

According to an embodiment of the invention, there is provided a solar battery module for a photoelectrolytic device comprising: a cylindrical holding member into which light can be introduced; the cylindrical holding member has a first end and a second end; a plurality of solar battery elements contained within the cylindrical holding member; at least some of the plurality of solar battery elements are connected with each other; a first electrolysis electrode; the first electrolysis electrode is electrically connected to a first outer solar battery element and the first end with a first seal; the first seal is liquid-tight; a second electrolysis electrode; the second electrolysis electrode is electrically connected to an opposite second outer solar battery element and the second end with a second seal; the second seal is liquid-tight; and the cylindrical holding member holding the plurality of solar battery elements in a cylindrical array which can be illuminated from any radial direction.

According to another embodiment of the invention, there is provided a photoelectrolytic device comprising: a container into which light can be introduced; at least one partition member; the at least one partition member partitioning the container into at least two distinct fluid isolated areas; a plurality of solar battery modules piercingly attached to the at least one partition member; the at least one partition member has a first surface and a second surface; an electrolyte substantially filling the container; each of the plurality of solar battery modules has an anode end and a cathode end; the cathode end is exposed to the electrolyte between the container and the first surface; the anode end is exposed to the electrolyte between the container and the second surface; a first means for circulating the electrolyte between the container and the first surface to replenish the electrolyte as the electrolyte is electrolyzed; a second means for circulating the electrolyte between the container and the second surface to replenish the electrolyte as the electrolyte is electrolyzed; a first collecting means for collecting electrolysis products created at the anode end; and a second collecting means for collecting electrolysis products created at the cathode end. dr

PREFERRED EMBODIMENTS OF THE INVENTION

The following is a description of examples of this invention, in which reference is made to the drawings.

Figure 1:
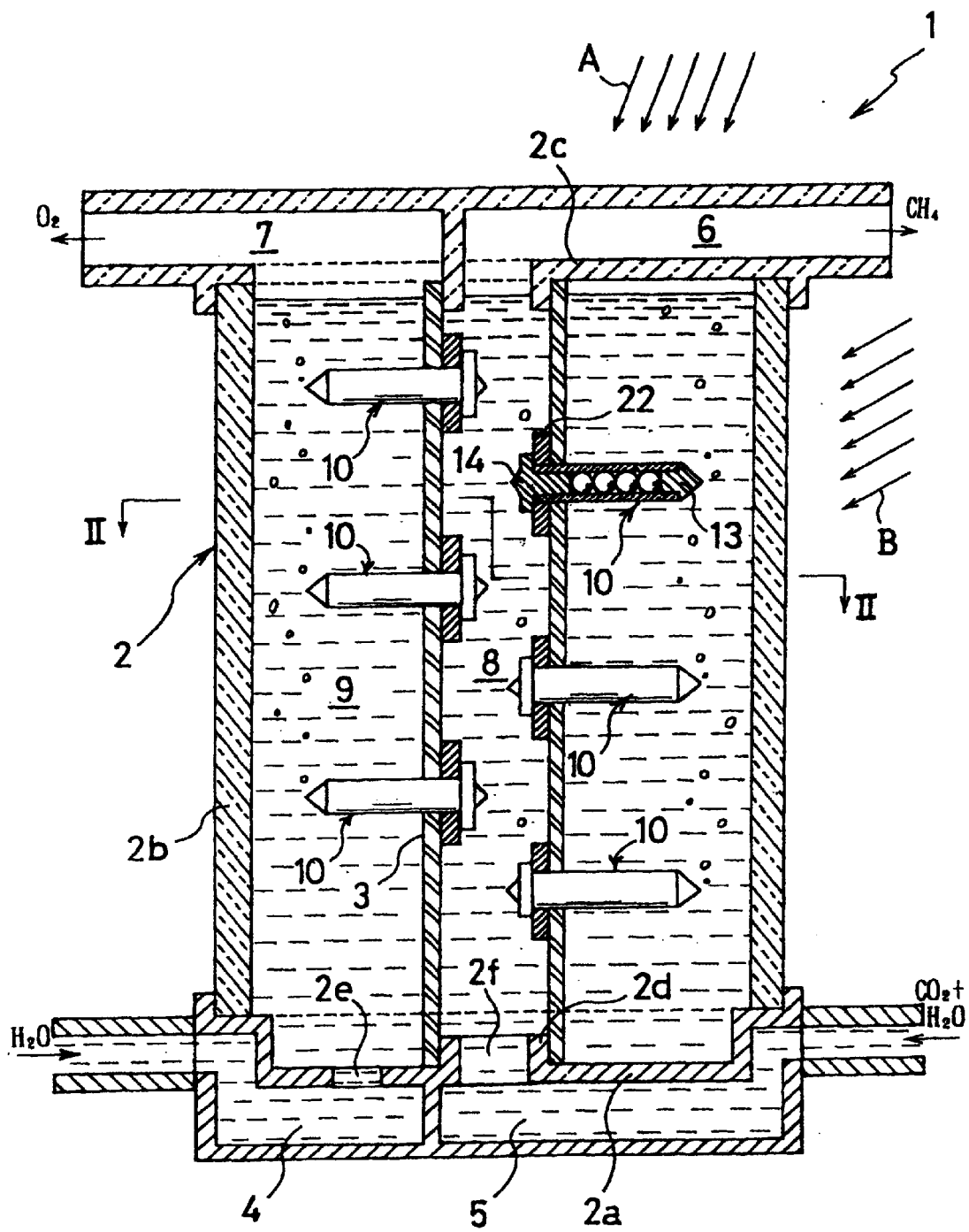
FIG. 1 is a vertical cross-sectional view of the photoelectrolytic device of example 1.
Figure 2:
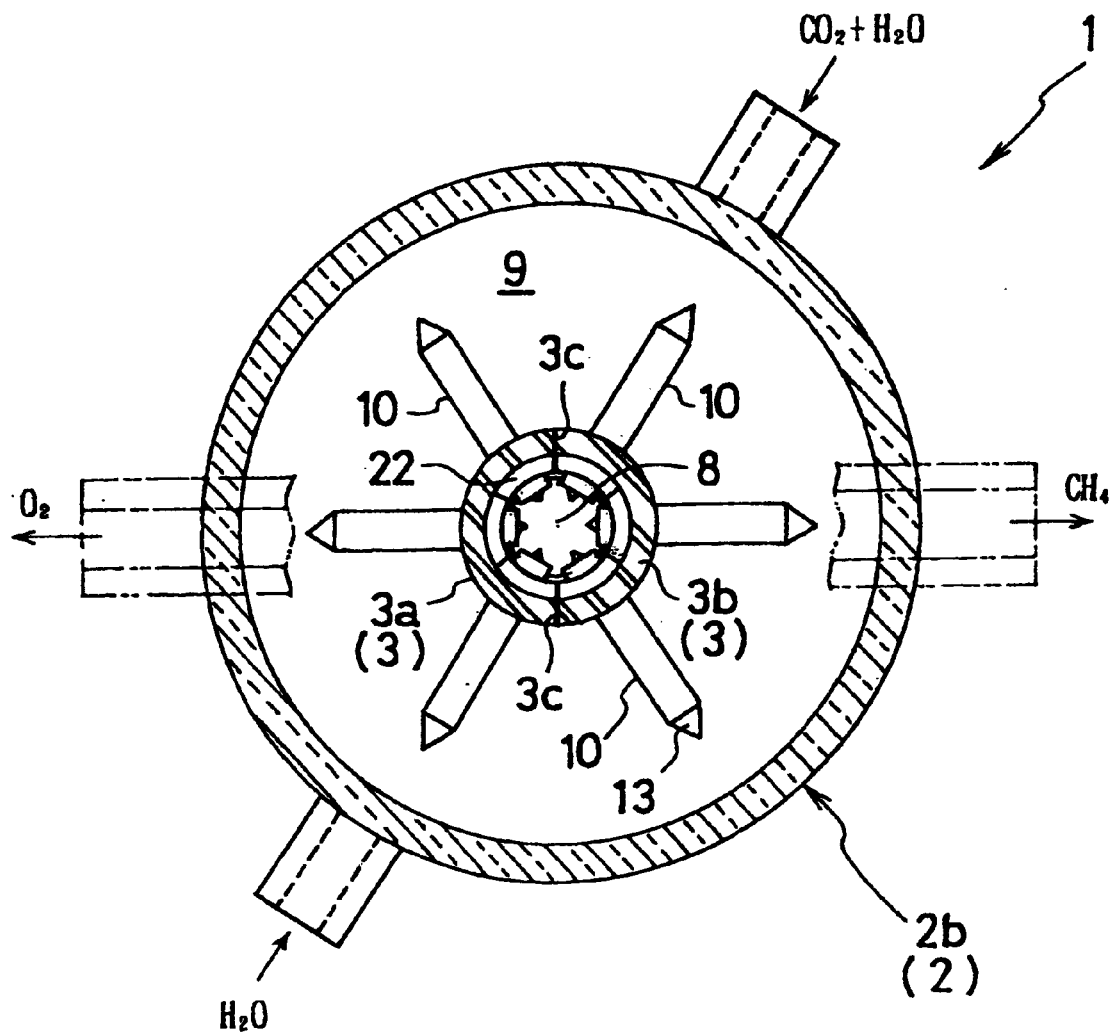
FIG. 2 is a cross-sectional view of FIG. 1 along line II—II.
Figure 3:
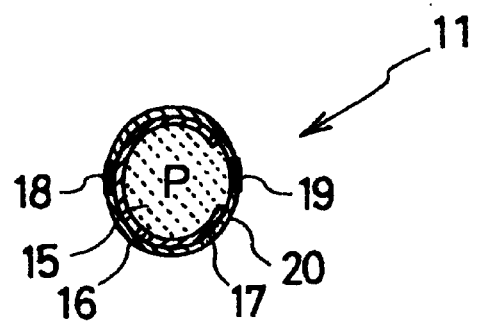
FIG. 3 is a cross-sectional view of a spherical solar battery element.

Example 1 (see FIGS. 1–3)

Photoelectrolytic device 1 in this example is a device that electrolyzes, by the photoelectromotive force produced by solar energy, an electrolytic solution of water and carbon dioxide gas, producing methane gas ($CH_4$) and oxygen gas ($O_2$).

As shown in FIGS. 1 and 2, this photoelectrolytic device 1 has a container 2 of circular cross-section that accommodates the electrolyte, a cylindrical partition member 3 provided in the center of this container 2, multiple solar battery modules 10 mounted on this partition member 3 and piercing it radially, first supply port 4 for supplying water and second supply port 5 for supplying carbon dioxide gas formed on the base wall part 2a of container 2, and first lead-out port 6 for taking out the methane gas and second lead-out port 7 for taking out the oxygen gas, each formed in pipe shape integrally with cover part 2c of container 2.

The container 2 has base wall part 2a, which is made of stainless steel or another metal, cylindrical wall part 2b, which is made of transparent glass, fits into the upper part of this base wall part 2a, and is secured by an inorganic adhesive, and cover part 2c, which is made of glass, fits into the upper part of this cylindrical wall part 2b, and covers it in a way that can be opened and closed; first and second supply ports 4 and 5 are formed on base wall part 2a, and first and second lead-out parts 6 and 7 are formed on cover part 2c.

The cylindrical partition member 3 consists of a hydrogen ion-conducting polymer electrolyte (for example, fluorine sulfonate), and the lower part of partition member 3 fits liquid-tightly around boss 2d of base wall part 2a. For mounting solar battery modules 10, partition member 3 consists of two split parts 3a and 3b that adhere on joining surface 3c on a vertical plane through the center. Also, partition member 3 can consist of an integral item if the length of a solar battery module 10 is formed smaller than the inside diameter of partition member 3.

The interior of partition member 3 is reduction reaction chamber 8, and the space between cylindrical wall part 2b and partition member 3 is oxidation reaction chamber 9; electrolysis cathode 14 of solar battery module 10 is in contact with the electrolyte in reduction reaction chamber 8, and electrolysis anode 13 of solar battery module 10 is in contact with the electrolyte in oxidation reaction chamber 9.

The first supply port 4 is connected to oxidation reaction chamber 9 through opening hole 2e in base wall part 2a, and second supply port 5 is connected to reduction reaction chamber 8 through opening hole 2f in boss 2d. First lead-out port 6 is connected to the upper end of reduction reaction chamber 8, and second lead-out port 7 is connected to the upper end of oxidation reaction chamber 9.

As shown in FIGS. 1 and 2, in the case of this example, a total of 18 solar battery modules 10 are provided, and in the view from the top these solar battery modules 10 are arranged around the circumference spaced, for example, 60<deg> apart, and the electrolysis cathodes 14 of the solar battery modules 10 are arranged at 18 different levels in the vertical direction in order to keep the cathodes as far apart from each other as possible.

Figure 4:
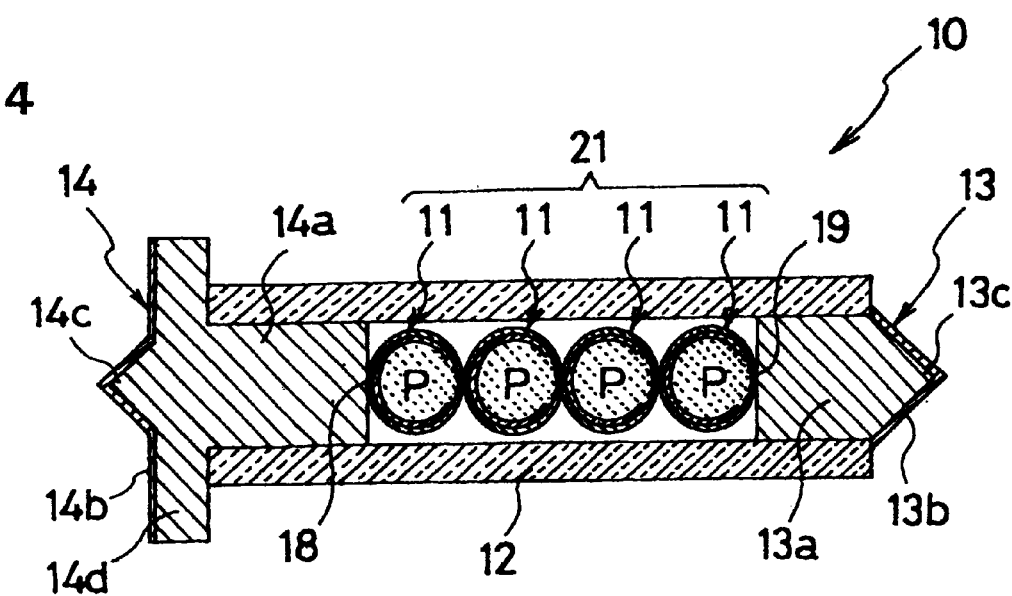
FIG. 4 is an enlarged cross-sectional view of a solar battery module of a photoelectrolytic device.

As shown in FIGS. 3 and 4, a solar battery module 10 has four spherical solar battery elements 11 whose diameter is, for example, 0.5–2.0 mm, holding member 12, which consists of a transparent quartz glass tube that accommodates and holds these solar battery elements 11 in a state in which they are electrically connected in series, and electrolysis anode 13 (the oxidation electrode) and electrolysis cathode 14 (the reduction electrode), which are mounted liquid-tightly on both ends of this holding member 12 and are exposed to the outside of holding member 12.

As shown in FIG. 3, a spherical solar battery element 11 (micro photoelectric cell) has spherical p-type silicon single crystal 15, n+ diffusion layer 16 formed by heat-diffusing phosphorus (P) onto much of its spherical surface, pn+ junction 17 of roughly spherical surface shape, negative electrode 18 and positive electrode 19 formed on both ends symmetrically about the center of p-type silicon single crystal 15, and anti-reflective coating 20, and formed on this spherical solar battery element 11 is a photoelectromotive force generation part that includes pn+ junction 17 (photoelectromotive force: 0.5–0.6 V). The phosphorus concentration of the n+ diffusion layer 16 is about $2 \times 10^{20}$ $cc^{-1}$, and pn+ junction 17 is formed in a position at a depth of about 0.5–1.0 μm from the spherical surface. Positive electrode 19 is electrically connected to the surface of p-type silicon single crystal 15, and negative electrode 18 is electrically connected to the surface of n+ diffusion layer 16. Positive electrode 19 is an ohmic contact having a thickness of, for example, 1.0 μm that consists of a vapor deposition film of titanium (Ti) and a vapor deposition film of nickel (Ni) on its outside surface, and negative electrode 18 is an ohmic contact of similar composition.

Reflection prevention film 20 is formed on the entire surface other than the surface of negative electrode 18 and positive electrode 19, and this reflection prevention film 20 consists of a $SiO_2$ coating (for example, thickness: 0.3–0.7 μm) and, on its surface, a $TiO_2$ coating (for example, thickness: 0.3–1.0 μm).

If spherical solar battery elements 11 are to be fabricated, a spherical solar battery element 11 can be fabricated by, for example, using an electromagnetic floating heating device at the top of a vertical dropping tube to melt p-type silicon grains as they float, allowing the melt to solidify as it falls through the vacuum of the dropping tube, thereby making spherical p-type silicon single crystals, and applying to these spherical p-type silicon single crystals various well known processing applied in semiconductor integrated circuit manufacturing technology and various similar processing.

As shown in FIG. 4, four spherical solar battery elements 11 are accommodated inside holding member 12 as a series-connected solar battery array 12 (photoelectromotive force: 2.0–2.4 V), electrolysis anode 13 is electrically connected to positive electrode 19 of solar battery array 21, and electrolysis cathode 14 is electrically connected to negative electrode 18 of solar battery array 21. Anode 13 consists of anode main body 13a, which consists of nickel (Ni), iron (Fe), or an alloy of them, and platinum (Pt) coating 13b, which is plated onto its outside surface and has a catalytic function, and cathode 14 consists of cathode main body 14a, which consists of nickel (Ni), iron (Fe), or an alloy of them, and copper (Cu) or copper-alloy coating 14b, which is plated onto its outside surface and has a catalytic function. Anode main body 13a of anode 13 is inserted into holding member 12, is fused with glass, and has a liquid-tight structure, and on the end of anode 13 is formed a pointy tip 13c for reducing the overvoltage and promoting the separation of reaction products.

Cathode main body 14a of cathode 14 is inserted into holding member 12, is fused with glass, and has a liquid-tight structure, and on the end of cathode 14 is formed sideward-facing T-shaped stopping part 14d, while in the middle part of stopping part 14d is formed a pointy tip 14c for reducing the overvoltage and promoting the separation of reaction products. The width of stopping part 14d is roughly the same as the outside diameter of holding member 12, and the height of stopping part 14d is greater than the outside diameter of holding member 12.

Before gluing together the pair of two split parts 3a and 3b of partition member 3, a ring-shaped spacer 22 made of an insulating material is put inside the through-holes of each of the two split parts 3a and 3b, solar battery module 10 is mounted by putting it through spacer 22 and the through-hole from the inside, then putting the two split parts 3a and 3b together and gluing them on surface 3c.

Next, we describe the operation of the above photoelectrolytic device 1.

When sunlight shines on this photoelectrolytic device 1 from above, for example as shown by arrows A, or as shown by arrows B, or from various other directions, a photoelectromotive force of about 0.5–0.6 V is generated by the photoelectromotive force generation part of each spherical solar battery element 11 of solar battery module 10. In spherical solar battery element 11, pn+ junctions 17 are formed over much of the surface of spherical p-type silicon single crystal 15, so it absorbs the incident light of wavelength 400–1000 nm that enters the photoelectromotive force generation part, efficiently converting the light to electricity; not only the directly incident sunlight, but also light reflected from the base or other surfaces of container 2 and light that is repeatedly reflected and dispersed within container 2 is efficiently absorbed and converted to electricity. In solar battery array 21, four spherical solar battery elements 11 are connected in series, so photoelectromotive force of about 2.0–2.4 V is generated by solar battery array 21 and appears at cathode 14 and anode 13.

In oxidation reaction chamber 9, the water is decomposed into hydrogen ions (H+) and oxygen ions (O−) on the surface of anode 13, and the oxygen ions are oxidized, producing oxygen gas ($O_2$). The hydrogen ions (H+) permeate through partition member 3, which is made of a polymer electrolyte that conducts hydrogen ions, and migrate into reduction reaction chamber 8, where reduction reactions between carbon dioxide gas ($CO_2$) and hydrogen ions (H+) take place on the surface of cathode 14, producing methane gas ($CH_4$). The oxygen gas that is produced in oxidation reaction chamber 9 is led out through second lead-out port 7 to an outside gas path not shown in the diagram, and the methane gas that is produced in reduction reaction chamber 8 is led out through first lead-out port 6 to an outside gas path not shown in the diagram.

In this solar battery module 10, the size of the photoelectromotive force can be varied by varying the number of series connections of spherical solar battery elements 11, which is advantageous for applying it to various kinds of photoelectrolytic devices. Holding member 12 is transparent, and spherical solar battery element 11 absorbs incident light from almost all directions, which is advantageous for the photoelectric conversion of light whose direction of incidence changes, such as sunlight. The formation of pointy tips 13c and 14c on anode 13 and cathode 14 can reduce overvoltage, promote the separation of reaction products, and promote electrolysis reactions. The formation of coatings 13b and 14b, which have a catalytic function, on the surface of anode 13 and cathode 14 can promote oxidation reactions and reduction reactions.

In the photoelectrolytic device 1, cylindrical wall part 2b and cover part 2c of container 2 are made of transparent glass, allowing light from various directions to enter solar battery module 10. Oxidation reaction chamber 9 and reduction reaction chamber 8 are partitioned from each other by partition member 3, which is made of a hydrogen ion-conducting polymer electrolyte, and solar battery modules 10 are mounted on this partition member 3, so the structure of photoelectrolytic device 1 is made simple by the fact that partition member 3 performs three functions: the function of separating reaction products (oxygen gas and methane gas), the function of allowing hydrogen ions to permeate through, and the function of supporting multiple solar battery modules 10. Also, this photoelectrolytic device 1 has is a composition in which photoelectromotive force is generated by multiple solar battery modules 10, which of course enhances the operation and effect of the solar battery modules 10.

The example has been described by taking as an example photoelectrolytic device 1, which produces methane gas and oxygen gas from water and carbon dioxide gas by the photoelectromotive force generated by solar energy, but besides this, it is also possible to electrolytically reduce carbon dioxide gas and produce ethylene ($CH_2=CH_2$), methanol ($CH_3OH$), ethanol ($C_2H_5OH$), formic acid (HCOOH), oxalic acid $(COOH)_2$, etc. In this case, it is desirable to appropriately set the size of the photoelectromotive force of solar battery array 21 by appropriately setting the number of series connections of spherical solar battery elements 11 in solar battery module 10, and to make cathode 14, or its coating 14b that has a catalytic function, from copper or a copper alloy.

Figure 5:
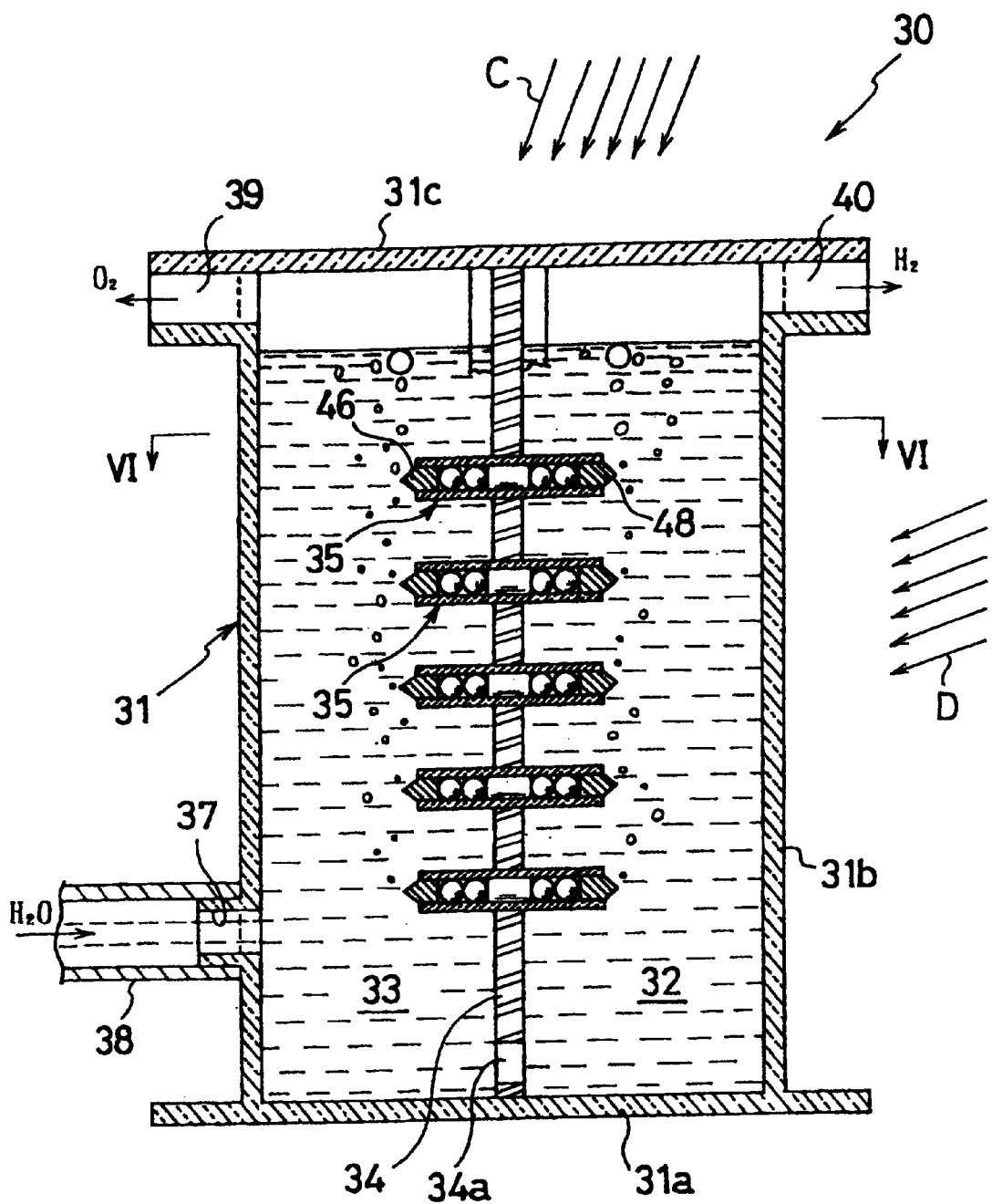
FIG. 5 is a vertical cross-sectional view of the photoelectrolytic device of example 2.
Figure 6:
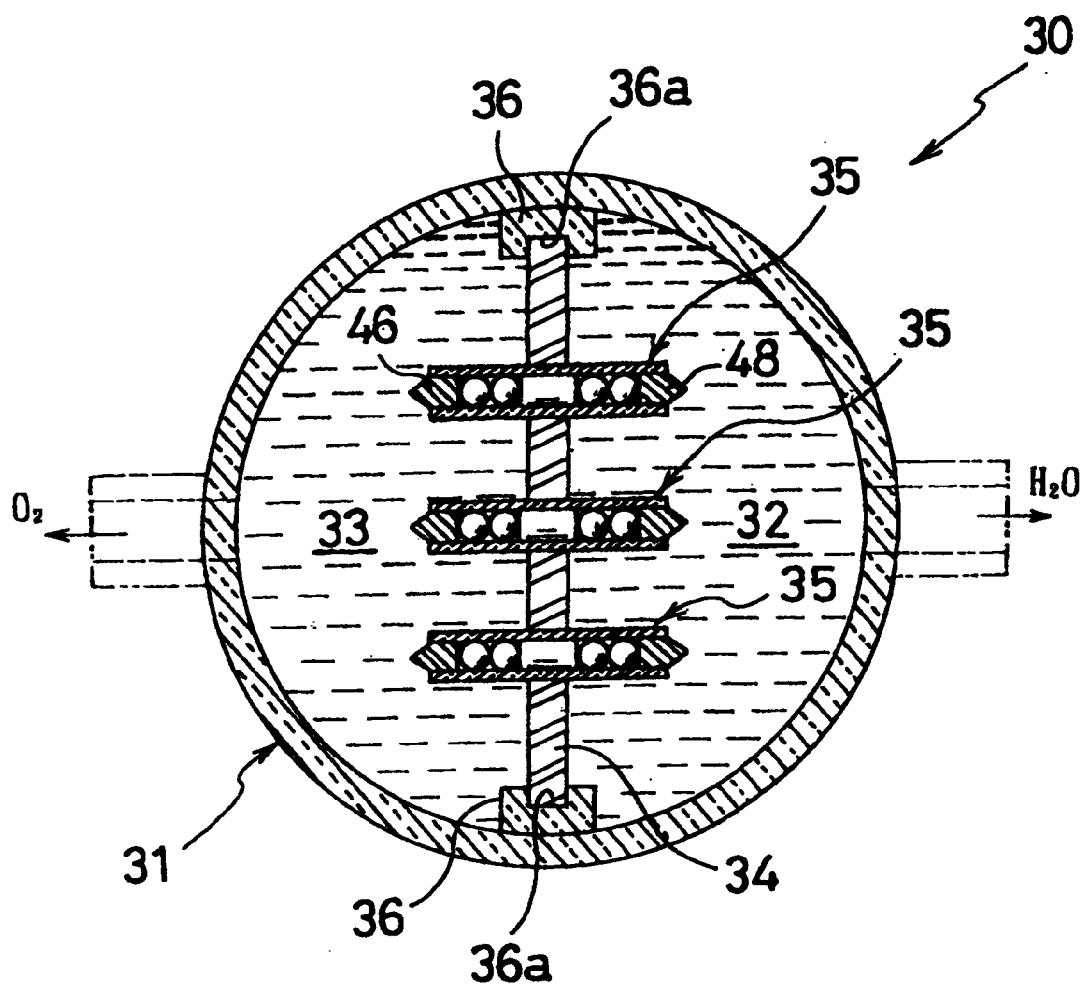
FIG. 6 is a cross-sectional view of FIG. 5 along line VI—VI.
Figure 7:
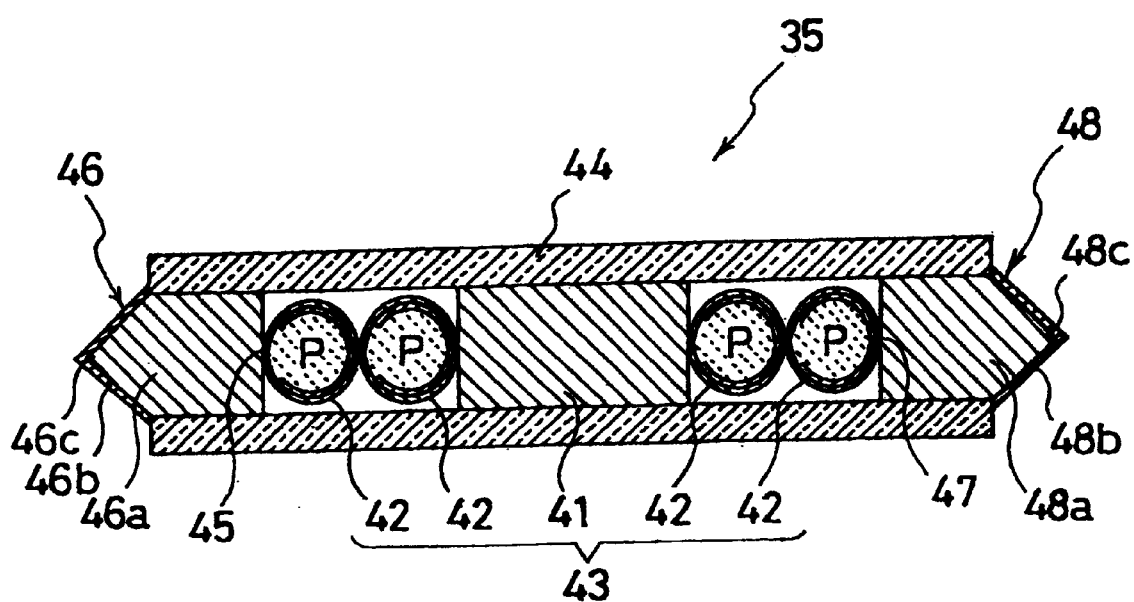
FIG. 7 is an enlarged cross-sectional view of a solar battery module of the photoelectrolytic device of FIG. 5.

Example 2 (see FIGS. 5–7)

Photoelectrolytic device 30 in this example is a device that produces hydrogen gas ($H_2$) and oxygen gas ($O_2$) by electrolyzing water as the electrolyte, powered by the photoelectromotive force generated by solar energy.

As shown in FIGS. 5 and 6, this photoelectrolytic device 30 has container 31, which has a circular cross-section, partition member 34, which partitions its interior into reduction reaction chamber 32 and oxidation reaction chamber 33, and, for example, 15 solar battery modules 35, which are mounted piercingly on this partition member 34. This container 31 has base wall 31a, cylindrical wall part 31b, which is integral with this base wall 31a, and cover plate 31c, which covers the upper end of this cylindrical wall part 31b so that it can be opened and closed. Fixed in mutually facing positions on the inside surface of cylindrical wall part 31b are guide members 36, which are made of quartz glass or stainless steel and in which are formed vertical grooves 36a. Formed on the lower part of cylindrical wall part 31b is one water supply port 37, and connected to this water supply port 37 is water supply pipe 38. Formed on the upper part of cylindrical wall part 31b are first lead-out port 39 for guiding out the oxygen gas from the upper end of oxidation reaction chamber 33 and second lead-out port 40 for guiding out the hydrogen gas from the upper end of reduction reaction chamber 32.

Like partition member 3 of the above example, partition member 34 is formed in the shape of a thin plate by a polymer electrolyte that conducts hydrogen ions; it is mounted slidably in grooves 36a in the pair of guide members 36, and formed near the lower end of partition member 34 is opening hole 34a to allow the water to flow through.

The 15 solar battery modules 35 are arranged in a matrix of five rows and three columns in a mode that pierces partition member 34, electrolysis cathodes 48 of these solar battery modules 35 are provided so as to make contact with the electrolyte inside reduction reaction chamber 32, and electrolysis anodes 46 are provided so as to make contact with the electrolyte inside oxidation reaction chamber 33.

As shown in FIG. 7, solar battery module 35 has solar battery array 43, which consists of relay conductor 41 in the middle and four spherical solar battery elements 42 connected in series via this relay conductor 41; holding member 44, which consists of a quartz glass tube that accommodates this solar battery array 43 in series-connected condition; electrolysis anode 46, which is electrically connected to positive electrode 45 of solar battery array 43; and electrolysis cathode 48, which is electrically connected to negative electrode 47 of solar battery array 43.

Spherical solar battery element 42 has the same structure and functions as spherical solar battery element 11 of the above example, so a description of it is omitted. The photoelectromotive force of spherical solar battery element 42 is 0.5–0.6 V, so the photoelectromotive force of solar battery array 43 is 2.0–2.4 V. Anode 46 consists of anode main body 46a, which is made of an iron-nickel alloy, and platinum coating 46b, which is on the surface of its tip and has a catalytic function, and on the end of anode 46 is formed a pointy tip 46c for reducing the overvoltage and promoting the separation of reaction products. Cathode 48, which has the same shape as anode 46, consists of cathode main body 48a, which is made of an iron-nickel alloy, and iridium (Ir) or iridium-alloy coating 48b, which is on the surface of its tip and has a catalytic function, and on the end of cathode 48 is formed a pointy tip 48c for reducing the overvoltage and promoting the separation of reaction products. Relay conductor 41 is also made of an iron-nickel alloy.

As shown in FIGS. 5 and 6, each solar battery module 35 goes through a through-hole formed in partition member 34 and is mounted so that its middle part in the longitudinal direction is positioned at the position of partition member 34, with anode 46 exposed to oxidation reaction chamber 33 and cathode 48 exposed to reduction reaction chamber 32.

We describe the operation of this photoelectric device 30.

When sunlight shines on this photoelectrolytic device 30 from above, for example as shown by arrows C, or as shown by arrows D, or from various other directions, a photoelectromotive force of about 0.5–0.6 V is generated by the photoelectromotive force generation part of each spherical solar battery element 42 of solar battery module 35 and appears at anode 46 and cathode 48. In oxidation reaction chamber 33, the water is decomposed into hydrogen ions (H+) and oxygen ions (O−) on the surface of anode 46, and the oxygen ions are oxidized, producing oxygen gas ($O_2$). The hydrogen ions (H+) permeate through partition member 34, which is made of a polymer electrolyte that conducts hydrogen ions, and migrate into reduction reaction chamber 32, where reduction reactions of the hydrogen ions (H+) take place, producing hydrogen gas ($H_2$). The oxygen gas that is produced in oxidation reaction chamber 33 is led out through first lead-out port 39 to an outside gas path not shown in the diagram, and the hydrogen gas that is produced in reduction reaction chamber 32 is led out through second lead-out port 40 to an outside gas path not shown in the diagram.

A solar battery module 35 of this photoelectrolytic device 30, besides having the same operation and effect as solar battery module 10 of aforesaid model 1, has relay conductor 41 built into it in the middle of holding member 44 in its longitudinal direction, which is advantageous for increasing the strength and rigidity of holding member 44, and is also advantageous for mounting solar battery module 35 on partition member 34. Also, the number of series connections of spherical solar battery elements 42 can be changed by changing the length of relay conductor 41. However, relay conductor 41 is not mandatory and may be omitted. In this photoelectrolytic device 30, partition member 34 is mounted detachably via grooves 36a in the pair of guide members 36, making it possible to remove solar battery modules 35 together with partition member 34, which is advantageous for the maintenance of solar battery modules 35.

Figure 8:
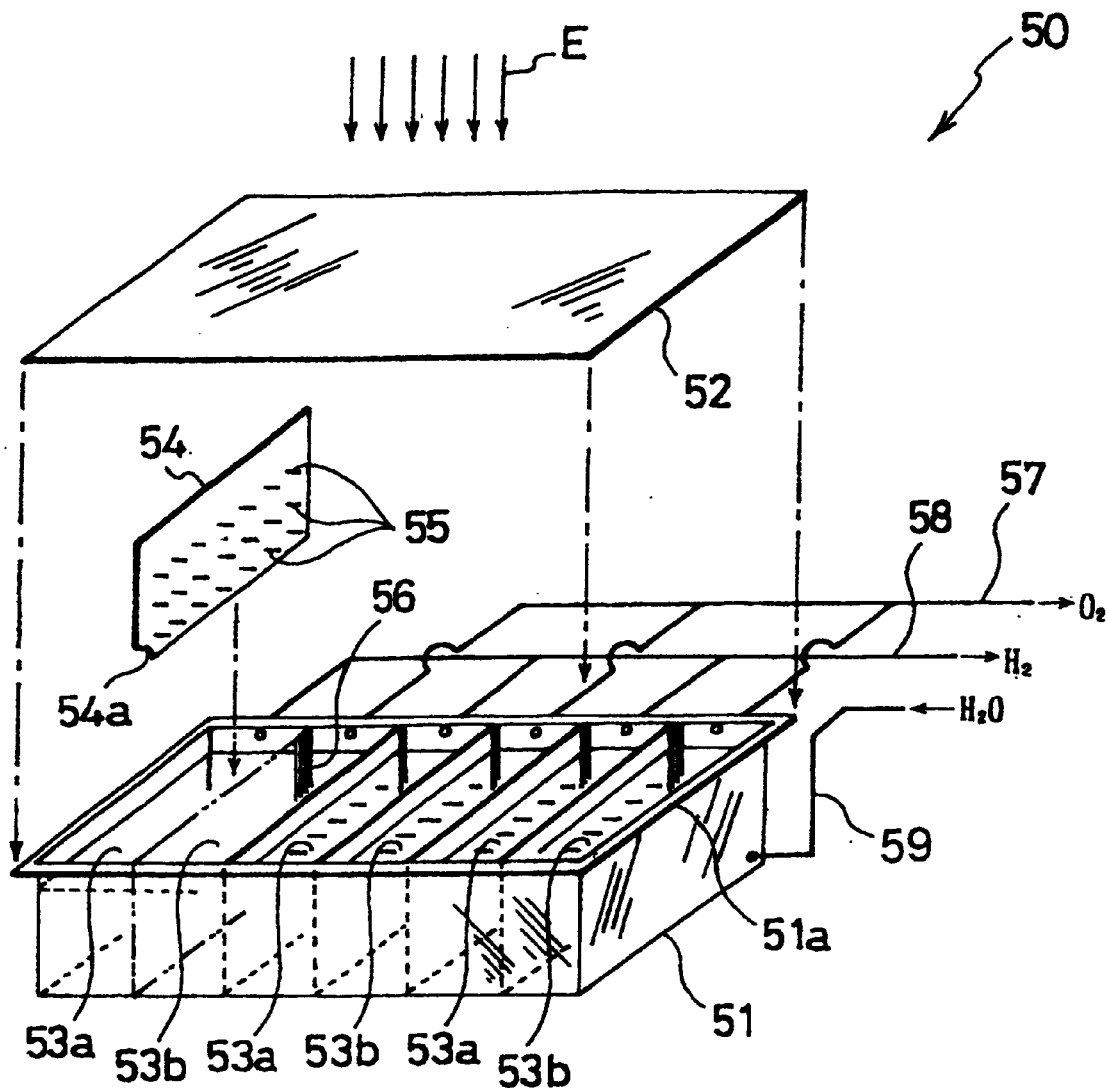
FIG. 8 is an exploded perspective view of the photoelectrolytic device of example 3.

Example 3 (see FIG. 8)

As in the above example 2, photoelectrolytic device 50 in this example is a device that produces hydrogen gas ($H_2$) and oxygen gas ($O_2$) by electrolyzing water as the electrolyte, powered by the photoelectromotive force generated by solar energy.

As shown in FIG. 8, this photoelectrolytic device 50 has box-shaped container 51, which is made of, for example, sheet stainless steel; cover plate 52, which is made of transparent glass and covers the upper end of container 51 so that it can be opened and closed; five partition plates 54 (partition members) that partition the interior of container 51 into six reaction chambers 53a and 53b; for example, 21 solar battery modules 55 mounted in each partition plate 54; water supply tube 59; oxygen gas lead-out tube 57; and hydrogen gas lead-out tube 58. On the inside surface of the side walls at the front and back of container 51 are glass or stainless-steel guide members 56 for mounting partition plates 54, and five pairs of guide members 56, which are similar to the guide members 36 of above example 2, are secured opposite each other in five places where the partition plates 54 are mounted. Each partition plate 54 is removably mounted by being air-tightly fitted into the grooves in one pair of guide members 56. Flange 51a is formed integrally on the upper rim of container 51. Seal material corresponding to flange 51a and seal material corresponding to the five partition plates 54 are secured by adhesion to the undersurface of cover plate 52, cover plate 52 is placed onto the upper rim of container 51, and cover plate 52 is fixed releasably to flange 51a by means of clamps and multiple screws not shown in the diagram.

Notch 54a for allowing water to pass through is formed on the front edge of the lower edge of partition plate 54, and the six reaction chambers 53a and 53b communicate via the notches 54a.

As with partition members 3 and 34 of the above examples, each partition plate 54 is formed into a thin plate of hydrogen ion-conducting polymer electrolyte, and the six reaction chambers 53a and 53b are arranged so that reduction reaction chambers 53a and oxidation reaction chambers 53b are positioned in alternation.

The hydrogen gas lead-out tube 58 is connected to the vapor-phase part of the upper part of the three reduction reaction chambers 53a, and oxygen gas lead-out tube 57 is connected to the vapor-phase part of the upper part of the three oxidation reaction chambers 53b. Each partition plate 54 has the same structure as solar battery module 35 of above example 2, the 21 solar battery modules 55 of the same function are mounted piercingly and in matrix form, the electrolysis cathodes of these solar battery modules 55 are exposed to the interior of the electrolyte of reduction reaction chambers 53a, and the electrolysis anodes are attached so as to be exposed to the interior of the electrolyte of oxidation reaction chambers 53b.

We describe the operation of this photoelectrolytic device 50.

When sunlight is shined onto this photoelectrolytic device 50 from above as shown by arrows E with container 51 filled with water as electrolyte to the prescribed level, a photoelectromotive force of 2.0–2.4 V is generated in each solar battery module 55, so, as in above example 2, hydrogen gas is produced from the surface of the cathodes in reduction reaction chambers 53a, and oxygen gas is produced from the surface of the anodes in oxidation reaction chambers 53b. The hydrogen gas is supplied to a hydrogen gas accommodation tank through hydrogen gas lead-out tube 58, and the oxygen gas is supplied to an oxygen accommodation tank through oxygen gas lead-out tube 57.

In this photoelectrolytic device 50, the cathodes of many solar battery modules 55 can be arranged in reduction reaction chambers 53a, and the anodes of many solar battery modules 55 can be arranged in oxidation reaction chambers 53b, which is suitable for making a large-capacity photoelectrolytic device. Light reflected by the side surfaces and base surface of stainless-steel container 51 can be guided into the electrolyte. Solar battery modules 55 can be removed together with partition member 54, which is advantageous for doing maintenance, such as cleaning the solar battery modules 55. The solar battery modules 55 themselves of this photoelectrolytic device have roughly the same operation and effect as the solar battery modules 10 and 35 of the above examples.

We describe how above examples 1–3 may be partially modified without departing from the gist of this invention.

1) In spherical solar battery element 11, an n-type silicon single crystal and a p+ diffusion layer may be provided instead of p-type silicon single crystal 15 and n+ diffusion layer 16. Instead of a silicon single crystal as the semiconductor that comprises the spherical crystal, one may employ single crystals or polycrystals of semiconductors such as germanium (Ge), mixed crystals Si—Ge of silicon and germanium, silicon carbide (SiC), gallium arsenide (GaAs), or indium phosphorus (InP).

2) The photoelectrolytic devices 1, 30, and 50 are not limited to the above modes of implementation; the solar battery module and photoelectrolytic device of this invention may be applied to various photoelectrolytic devices that are used for the electrolysis of various electrolytes. In this case, the photoelectromotive force of the solar battery module is appropriately set by appropriately setting the number of series connections of spherical solar cell elements 11 in accordance with the required electrolysis voltage.

3) The material from which the electrolysis anodes and cathodes are made is not limited to what has been referred to above. Pointy tips 13c, 14c, 46c, and 48c formed on the anodes and cathodes are not mandatory and may be omitted. The material of the catalytic-function coating on the surface of the anodes and of the catalytic-function coating on the surface of the cathodes is not limited to what has been referred to above; one uses a functional material that fits the reaction products.

4) The partition members 3 and 34 and partition plates 54 may be made of a hydrogen ion-conducting polymer electrolyte other than the aforementioned, or may be made of a positive ion-conducting polymer electrolyte or negative ion-conducting polymer electrolyte that fits the reaction products. If an opening to allow electrolytic solution to flow through (corresponding to opening hole 34a and notch 54a) is to be formed in partition members 3 and 34 or partition plates 54, it is not always necessary that partition members 3 and 34 or partition plates 54 be made of an ion-conducting polymer electrolyte in order for the ions in the electrolytic solution to migrate through this opening to allow the electrolytic solution to flow through; they may also be made with a gas separation material that has the function of separating the gases produced by the electrolytic reactions. For example, if hydrogen gas and oxygen gas produced by electrolytic reactions are to be separated, they may be made with a gas separation material such as polyurethane or polycarbonate. And because the solar battery module is small and light, partition members 3 and 34 or partition plates 54 do not necessarily need to be made in plate form; they may be made with one or more films having gas separation function, and they may be combined with a frame made of metal, synthetic resin, or glass that supports the outside perimeter of one film and another.

What is claimed is:

1. A solar battery module for a photoelectrolytic device comprising:

a cylindrical holding member into which light can be introduced;

said cylindrical holding member has a first end and a second end;

a plurality of solar battery elements contained within said cylindrical holding member;

at least some of said plurality of solar battery elements are connected with each other;

a first electrolysis electrode;

said first electrolysis electrode is electrically connected to a first outer solar battery element and said first end with a first seal;

said first seal is liquid-tight;

a second electrolysis electrode;

said second electrolysis electrode is electrically connected to an opposite second outer solar battery element and said second end with a second seal;

said second seal is liquid-tight; and said cylindrical holding member holding said plurality of solar battery elements in a cylindrical array which can be illuminated from any radial direction.

2. A solar battery module for a photoelectrolytic device according to claim 1, wherein;

said solar battery elements are substantially spherical.

3. A solar battery module for a photoelectrolytic device according to claim 1, wherein;

said solar battery elements are p-type semiconductors.

4. A solar battery module for a photoelectrolytic device according to claim 1, wherein;

said solar battery elements are n-type semiconductors.

5. A solar battery module for a photoelectrolytic device according to claim 1 wherein;

said solar battery elements are polycrystal semiconductors.

6. A solar battery module for a photoelectrolytic device according to claim 1, wherein;

said solar battery elements include a pn junction.

7. A solar battery module for a photoelectrolytic device according to claim 1, wherein;

said solar battery module is immersed in an electrolyte.

8. A solar battery module for a photoelectrolytic device according to claim 1, wherein;

a number of said solar battery elements is set according to a desired output voltage and a electrolysis voltage needed for an electrolyte.

9. A solar battery module for a photoelectrolytic device according to claim 1, wherein;

at least one of said first electrolysis electrode and second electrolysis electrode is coated with a catalytic metal coating to promote electrolysis.

10. A solar battery module for a photoelectrolytic device according to claim 1, wherein;

at least one of said first electrolysis electrode and second electrolysis electrode has a pointy tip to reduce overvoltage and to promote electrolysis.

11. A solar battery module for a photoelectrolytic device according to claim 1, wherein;
said solar battery module has a relay conductor interposed between at least one of said solar battery element.

12. A photoelectrolytic device comprising:
a container into which light can be introduced;
at least one partition member;
said at least one partition member partitioning said container into at least two distinct fluid isolated areas;
a plurality of solar battery modules piercingly attached to said at least one partition member;
said at least one partition member has a first surface and a second surface;
an electrolyte substantially filling said container;
each of said plurality of solar battery modules has an anode end and a cathode end;
said cathode end is exposed to said electrolyte between said container and said first surface;
said anode end is exposed to said electrolyte between said container and said second surface;
a first means for circulating said electrolyte between said container and said first surface to replenish said electrolyte as said electrolyte is electrolyzed;
a second means for circulating said electrolyte between said container and said second surface to replenish said electrolyte as said electrolyte is electrolyzed;
a first collecting means for collecting electrolysis products created at said anode end; and
a second collecting means for collecting electrolysis products created at said cathode end.

13. A photoelectrolytic device according to claim 12, wherein;
each said solar battery module comprises;
a solar battery module for a photoelectrolytic device comprising:
a cylindrical holding member into which light can be introduced;
said cylindrical holding member has a first end and a second end;
a plurality of solar battery elements contained within said cylindrical holding member;
at least some of said plurality of solar battery elements are connected with each other;
a first electrolysis electrode;
said first electrolysis electrode is electrically connected to a first outer solar battery element and said first end with a first seal;
said first seal is liquid-tight;
a second electrolysis electrode;
said second electrolysis electrode is electrically connected to an opposite second outer solar battery element and said second end with a second seal;
said second seal is liquid-tight; and
said cylindrical holding member holding said plurality of solar battery elements in a cylindrical array which can be illuminated from any radial direction.

14. A photoelectrolytic device according to claim 13, wherein;
said solar battery elements are substantially spherical.

15. A photoelectrolytic device according to claim 13, wherein;
said solar battery elements are p-type semiconductors.

16. A photoelectrolytic device according to claim 13, wherein;
said solar battery elements are n-type semiconductors.

17. A photoelectrolytic device according to claim 13, wherein;
said solar battery elements include a pn junction.

18. A photoelectrolytic device according to claim 13, wherein;
said solar battery modules are immersed in an electrolyte.

19. A photoelectrolytic device according to claim 13, wherein;
a number of said solar battery elements is set according to a desired output voltage and an electrolysis voltage needed for an electrolyte.

20. A photoelectrolytic device according to claim 13, wherein;
at least one of said first electrolysis electrode and second electrolysis electrode is coated with a catalytic metal coating to promote electrolysis.

21. A photoelectrolytic device according to claim 13, wherein;
at least one of said first electrolysis electrode and second electrolysis electrode has a pointy tip to reduce overvoltage and to promote electrolysis.

22. A photoelectrolytic device according to claim 13, wherein;
said container permits light to enter from at least from above.

23. A photoelectrolytic device according to claim 13, wherein;
said partition member is made of a polymer electrolyte.

24. A photoelectrolytic device according to claim 13, wherein;
said polymer electrolyte is a hydrogen ion conductor.

25. A photoelectrolytic device according to claim 13, wherein;
said container is glass.

26. A photoelectrolytic device according to claim 13, wherein;
said at least one partition member is substantially circular;
said plurality of said solar battery modules are radially attached to said at least one partition member.

27. A photoelectrolytic device according to claim 13, wherein;
said at least one partition member is a hydrogen ion-conducting polymer electrolyte.

28. A photoelectrolytic device according to claim 13, wherein;
said at least one partition member is a positive ion-conducting polymer electrolyte.

29. A photoelectrolytic device according to claim 13, wherein;
said at least one partition member is a negative ion-conducting polymer electrolyte.

30. A photoelectrolytic device according to claim 13, wherein; said at least one partition members are removable.

* * * * *